(12) United States Patent
Tsai et al.

(10) Patent No.: US 7,106,088 B2
(45) Date of Patent: Sep. 12, 2006

(54) METHOD OF PREDICTING HIGH-K SEMICONDUCTOR DEVICE LIFETIME

(75) Inventors: Ching-Wei Tsai, Taoyuan (TW); Chih-Hao Wang, Hsin-Chu (TW); Min-Hwa Chi, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 11/077,463

(22) Filed: Mar. 10, 2005

(65) Prior Publication Data

US 2006/0158210 A1 Jul. 20, 2006

Related U.S. Application Data

(60) Provisional application No. 60/642,574, filed on Jan. 10, 2005.

(51) Int. Cl.
*G01R 31/26* (2006.01)

(52) U.S. Cl. ...................................................... 324/769
(58) Field of Classification Search ................. 324/765, 324/769
See application file for complete search history.

(56) References Cited

U.S. PATENT DOCUMENTS

| 4,816,753 | A | * | 3/1989 | Palkuti | 324/501 |
|---|---|---|---|---|---|
| 4,873,557 | A | | 10/1989 | Kita | |
| 5,028,554 | A | | 7/1991 | Kita | |
| 5,508,632 | A | * | 4/1996 | Shimizu et al. | 324/769 |
| 5,600,578 | A | | 2/1997 | Fang et al. | |
| 5,608,338 | A | * | 3/1997 | Maeda | 324/770 |
| 5,615,377 | A | * | 3/1997 | Shimizu et al. | 703/13 |
| 5,999,011 | A | | 12/1999 | Chu et al. | |
| 6,049,213 | A | * | 4/2000 | Abadeer | 324/719 |
| 6,063,698 | A | | 5/2000 | Tseng et al. | |
| 6,151,561 | A | * | 11/2000 | Maeda | 702/58 |
| 6,173,235 | B1 | * | 1/2001 | Maeda | 702/58 |
| 6,326,792 | B1 | | 12/2001 | Okada | |
| 6,525,544 | B1 | * | 2/2003 | Okada | 324/551 |
| 6,541,285 | B1 | * | 4/2003 | Koike | 438/14 |
| 6,587,994 | B1 | | 7/2003 | Yamaji | |
| 6,633,177 | B1 | | 10/2003 | Okada | |
| 6,815,970 | B1 | | 11/2004 | Rost et al. | |
| 6,825,684 | B1 | * | 11/2004 | Kim et al. | 324/765 |

(Continued)

OTHER PUBLICATIONS

Kimizuka, N., et al., "NBTI Enhancement by Nitrogen Incorporation into Ultrathin Gate Oxide for 0.10-μm Gate CMOS Generation," Symposium on VLSI Technology Digest of Technical Papers (2000) pp. 92-93.

(Continued)

*Primary Examiner*—Evan Pert
(74) *Attorney, Agent, or Firm*—Slater & Matsil, L.L.P.

(57) ABSTRACT

A preferred embodiment of the invention provides a method for testing a MISFET to determine the effect of hot carrier injection (HCI) on integrated circuit lifetime. The method comprises applying a positive stress voltage to a gate having a high-k dielectric, while simultaneously holding a drain voltage equal to the stress voltage. Using a stress voltage that is greater than a normal operating voltage accelerates the degradation and failure of the integrated circuit. Embodiments include monitoring electrical parameters such as threshold voltage, transconductance, linear drain current, or saturation drain current. A pre-selected shift in a monitored electrical parameter indicates device failure. Embodiments include analyzing the data by plotting the logarithm of an accelerated device lifetime versus the gate stress voltage. The device lifetime under operating conditions is predicted by extrapolating the plot for a given device operating voltage.

21 Claims, 6 Drawing Sheets

U.S. PATENT DOCUMENTS 6,963,215 B1 * 11/2005 Mastrapasqua ............. 324/766
2004/0109379 A1 6/2004 Chih et al.

OTHER PUBLICATIONS

Marachand, B., et al., "Hot Carrier Effects and Time-Dependent Degradation Laws in 0.1 μm Bulk Silicon Si n-MOSFETs," 27th European Solid-State Device Research Conference (Sep. 1997) 4 pages.

Takayanagi, M., et al., "Investigation of Hot Carrier Effects in n-MISFETs with HfSiON Gate Dielectric," 42nd Annual International Reliability Physics Symposium (2004) pp. 13-17.

Li, E., et al., "Hot Carrier Induced Degradation in Deep Submicron MOSFETs at 100° C.," 38th Annual International Reliability Physics Symposium (2000) pp. 103-107.

Li, E., et al., "Projecting Lifetime of Deep Submicron MOSFETs," IEEE Transactions on Electron Devices, vol. 48, No. 4 (Apr. 2001) pp. 671-678.

Stathis, J.H., "Reliability Limits for the Gate Insulator in CMOS Technology," IBM J. Res. & Dev., vol. 46, No. 2/3 (Mar./May 2002) pp. 265-286.

Takasaki, K., et al., "Impact of Nitrogen Profile in Gate Nitrided-Oxide on Deep-Submicron CMOS Performance and Reliability," FUJITSU Sci. Tech. J., vol. 39, No. 1 (Jun. 2003) pp. 40-51.

Pagey, M.P., "Characterization and Modeling of Hot-Carrier Degradation in Sub-Micron NMOSFETS," Thesis, Graduate School of Vanderbilt University (Aug. 2002) pp. 1-60.

* cited by examiner

SiON:

FIG. 5a

High-K:

METHOD OF PREDICTING HIGH-K SEMICONDUCTOR DEVICE LIFETIME

This application claims the benefit of U.S. Provisional Application No. 60/642,574, filed on Jan. 10, 2005, entitled Method of Predicting High-K Semiconductor Device Lifetime, which application is hereby incorporated herein by reference.

TECHNICAL FIELD

This invention relates generally to the fabrication of semiconductor devices, and more particularly to the prediction of device lifetime degradation caused by hot carrier effects in high dielectric constant (high-k) gate dielectrics.

BACKGROUND

As metal insulator semiconductor field effect transistor (MISFET) feature sizes decrease, the gate oxide thickness of the devices also decreases. This decrease is driven in part by the demands of overall device scaling. As gate conductor widths decrease, for example, other device dimensions decrease to maintain the proper device scale, and thus device operation. Another factor driving reduction of the gate oxide thickness is the increased transistor drain current realized from a reduced gate dielectric thickness. The transistor drain current is proportional to the amount of charge induced in the transistor channel region by the voltage applied to the gate conductor. The amount of charge induced by a given voltage drop across the gate dielectric (e.g., the gate oxide) is a factor of the capacitance of the gate dielectric.

The need to achieve increased capacitance has led to the use of materials that have dielectric constants that are greater than the dielectric constant of silicon oxide, which has a k value of about 3.9. Higher k values, for example 20 or more, may be obtained with various transition metal oxides. These high-k materials allow high capacitances to be achieved with relatively thick dielectric layers.

There are, however, device performance problems associated with high-k gate dielectric layers. The increased electric field needed for higher speed adversely affects device performance through hot carrier (HC) injection and trap generation. Traps influence both subthreshold slope and threshold voltage ($V_t$). High trap density also leads to leakage through Frenkel-Poole tunneling, and it causes bias temperature instability. Given the ever-increasing demand for improved device performance, hot carrier damage is one of the most significant long-term reliability concerns in semiconductor device fabrication today.

A class of high-k dielectrics that has received much attention recently is hafnium-based oxides. Unlike $SiO_2$, wherein chemical bonding is predominately covalent, Hf-based oxides are predominately ionic and therefore exhibit their own host of problems. One such problem is that conventional accelerated stressing experiments used to predict device lifetime have proven unreliable. Commonly measured parameters such as ring oscillator speed, threshold voltage ($V_t$), linear transconductance ($G_{m,lin}$), saturation transconductance ($G_{m,sat}$), linear drain current ($I_{DLIN}$), and saturation drain current ($I_{DSAT}$) sometimes yield conflicting results. In some cases, conventional methods overestimate device lifetime by several orders of magnitude.

Accordingly, there is a need in semiconductor manufacturing for improved methods for measuring hot carrier degradation and its effect on device lifetime.

SUMMARY OF THE INVENTION

These and other problems are generally solved or circumvented, and technical advantages are generally achieved by preferred embodiments of the present invention that provide a testing method for predicting semiconductor device lifetime.

An alternative embodiment of the invention provides a method for predicting a lifetime of a MISFET having a high-k gate dielectric. The method comprises applying a stress bias to a MISFET gate and holding a MISFET drain voltage equal to or less than the stress bias. Embodiments further include measuring an accelerated device lifetime from a cumulative time needed for the stress bias to cause a pre-selected electrical MISFET parameter shift and deriving a functional relationship between the accelerated device lifetime and the stress bias. Preferred embodiments include calculating the MISFET lifetime by inputting the MISFET operating voltage into the functional relationship between accelerated device lifetime and stress bias and extrapolating a time corresponding to the MISFET operating voltage.

An alternative embodiment provides a method to predict a lifetime of an integrated circuit. The method comprises performing an accelerated stress measurement, wherein the accelerated stress measurement comprises applying a positive voltage bias to a NMOS gate, wherein the NMOS gate includes a high-k gate dielectric; simultaneously setting a NMOS drain bias equal to or less than the stress bias; and measuring an accelerated device lifetime. Preferably, the accelerated device lifetime is the time required for the positive bias stress voltage to cause a pre-selected, integrated circuit parameter shift. Alternative embodiments include deriving a functional relationship between the accelerated device lifetime and the positive voltage bias and inputting a device operating voltage into the functional relationship. Embodiments preferably further include numerically extrapolating the corresponding time, wherein the corresponding time provides an estimate of the lifetime of the integrated circuit at normal operating conditions.

Preferred embodiments include measuring at least one electrical parameter of the device after applying the stress. The cycle of stressing and measuring repeats until a pre-selected level of hot carrier (HC) electrical degradation of the device occurs. All parameters can be easily measured using an I-V meter. Since HC degradation exhibits a positive temperature dependence, alternate embodiments include performing the stressing experiments above room temperature (above about 25° C.). In one embodiment, the HC stress temperature is about 85° C. to 125° C.

In preferred embodiments, the pre-selected level of device degradation is defined as the stress condition that causes a shift in linear transconductance ($G_{m,lin}$), a shift in saturation transconductance ($G_{m,sat}$), a shift in linear drain current ($I_{DLIN}$), a shift in saturation drain current ($I_{DSAT}$), a loss in ring oscillator speed or a shift in threshold voltage ($V_t$). Data analysis includes predicting device lifetime at actual operating conditions (i.e. actual $V_G$) by extrapolating a plot of the logarithm of accelerated device lifetime under stressing conditions vs. $V_G$, to target device lifetime for actual, operating $V_G$.

In another embodiment, the pre-selected level of device degradation is defined as the stress condition that causes a 10% shift in linear transconductance ($G_{m,lin}$), 10% shift in saturation transconductance ($G_{m,sat}$), a 10% shift in linear drain current ($I_{DLIN}$), a 10% shift in saturation drain current ($I_{DSAT}$), a 10% loss in ring oscillator speed, or a 20 mV shift in threshold voltage ($V_t$). Data analysis preferably includes predicting device lifetime at actual operating conditions (i.e. actual $V_G$) by extrapolating a plot of the logarithm of accelerated device lifetime under stressing conditions vs. $V_G$, to target device lifetime for actual, operating $V_G$.

Additional features and advantages of embodiments of the invention will be described hereinafter, which form the subject of the claims of the invention. It should be appreciated by those skilled in the art that the specific embodiments disclosed might be readily utilized as a basis for modifying or designing other structures or processes for carrying out the purposes of the present invention. It should also be realized by those skilled in the art that such equivalent constructions and variations on the example embodiments described do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The operation and fabrication of the presently preferred embodiments are discussed in detail below. However, the embodiments and examples described herein are not the only applications or uses contemplated for the invention. The specific embodiments discussed are merely illustrative of specific ways to make and use the invention, and do not limit the scope of the invention or the appended claims.

The present invention will now be described with respect to preferred embodiments in a specific context, namely predicting the lifetime of an integrated circuit using hot carrier injection (HCI) accelerated stress measurements of a NMOS. A stress voltage is applied at both the gate and the drain, the stress gate voltage being appropriate for inducing positive bias temperature instability (PBTI) degradation in a NMOS transistor. It is believed that embodiments of this invention are particularly advantageous when used in this process. It is further believed that embodiments described herein will benefit other integrated circuit applications not specifically mentioned. Therefore, the specific embodiments discussed are merely illustrative of specific ways to make and use the invention, and do not limit the scope of the invention.

Figure 1:
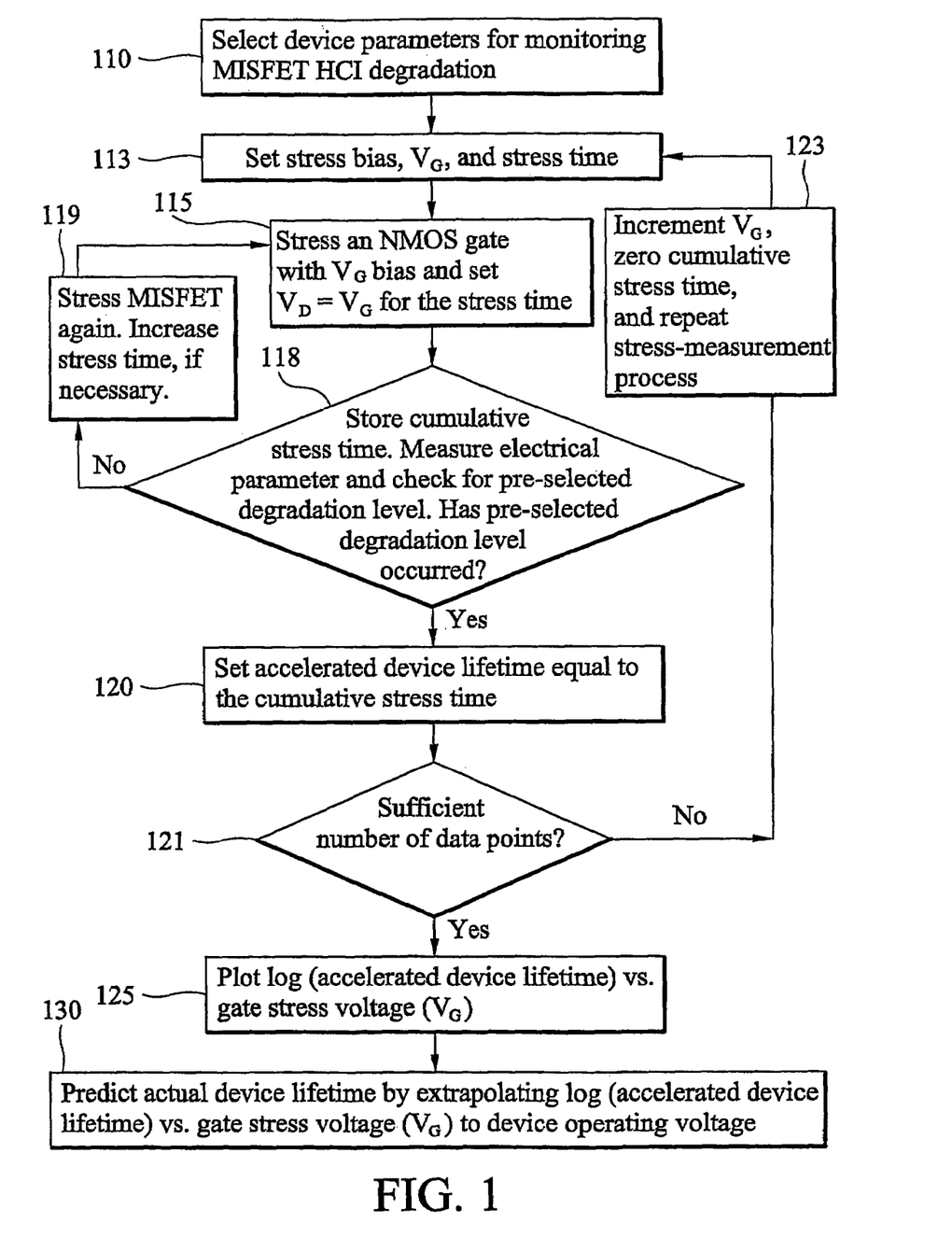
FIG. 1 is a process flowchart illustrating a method of predicting MISFET lifetime according to preferred embodiments of the invention.

FIG. 1 illustrates a method of testing an integrated circuit having a high-k gate dielectric in accordance with preferred embodiments of the invention. Preferred embodiments are particularly useful with HfSiON gate dielectrics, however, the method is useful with other high-k gate dielectrics as well. In preferred embodiments, high-k dielectrics include HfSiON, nitrided $Al_2O_3$, and other dielectrics having a dielectric constant greater than about 7. Non-high-k dielectrics include $SiO_x$ and SiON.

As indicated, the method begins at Step 110 by selecting parameters useful for monitoring HCI degradation of a high-k dielectric, MISFET integrated circuit device. In one test case, the MISFET integrated circuit device included a HfSiON gate dielectric fabricated in a CMOS process. The CMOS process included forming poly-Si gates, S/D implants, a S/D activation anneal, and cobalt salicidation. High temperature annealing occurred at approximately 1100° C. to activate the S/D implants.

Device lifetime measurement accelerated by HCI is one of the imperative items for device lifetime prediction, and it is the preferred way for device AC (switching) lifetime.

Continuing with step 110 of FIG. 1, typical parameters for measuring device performance include threshold voltage ($V_t$), linear transconductance ($G_{m,lin}$), saturation transconductance ($G_{m,sat}$), linear drain current ($I_{DLIN}$), or saturation drain current ($I_{DSAT}$). These parameters are initially determined before the accelerated stress testing and are again measured after each stress period. They are measured using conventional methods, known in the art.

The accelerated device lifetime is defined as the cumulative stress time at which the pre-selected degradation in a device parameter is observed. In accordance with preferred embodiments, an accelerated device lifetime is defined as the cumulative stress time required to cause about a 10% shift in $G_{m,lin}$, $G_{m,sat}$, $I_{DLIN}$, $I_{DSAT}$, or about a 20 mV shift in $V_t$ from the unstressed values. Therefore, step 110 in FIG. 1, by way of example, may include selecting threshold voltage as the electrical parameter to monitor and selecting a 20 mV shift as a criteria for device failure.

Continuing with FIG. 1, step 113 includes setting a stress bias, wherein the stress bias is a positive gate bias, $V_G>0$. Preferably, $V_G$ is larger than the operating voltage of the device. With a 1.2 V device (i.e. operating voltage is 1.2 V), $1.2<V_G<3$ V yield satisfactory results. Step 113 also includes setting a stress time for stressing the MISFET device.

In step 115, the MISFET is stressed by applying the stress bias to an NMOS within the MISFET for the stress time. According to preferred embodiments, step 115 further comprises applying an NMOS drain bias voltage, $V_D$, with $V_D=V_G$, as this condition shows maximum hot carrier degradation. For reasons described in detail below, Applicants have found that preferred embodiments of the invention are a much more accurate predictor of MISFET device lifetime compared to conventional methods used for non-high-k dielectric devices.

After stressing the MISFET with $V_D=V_G>0$, for the stress time, step 115, at least one device parameter, such as $G_{m,lin}$, $G_{m,sat}$, $I_{DLIN}$, $I_{DSAT}$, or $V_t$ is measured, as illustrated, step 118. In step 118 a cumulative stress time is set equal to a summation of all stress time for the current stress condition. Step 118 further includes determining whether the device parameter exhibits the pre-selected level of degradation. If sufficient degradation is not observed, step 119 occurs.

Step 119 comprises two tasks. First, the MISFET is transferred from a measurement station, step 118, back to a stress station, step 115. Step 119 also includes determining whether the stress time is likely to induce degradation within a practical period. For example, if after a stress/measurement sequence (steps 115 & 118), little or no degradation occurs, step 119 increases the stress time, for example by 2 times of the stress time.

If the pre-selected level of degradation is measured in step 118, embodiments of the method proceed to step 120. Step 120 includes setting accelerated device lifetime equal to the cumulative stress time. Then embodiments of the method proceed to step 121. Step 121 includes storing at least accelerated device lifetime and stress bias in a database. Step 121 also checks whether a pre-selected number of data points (i.e. pairs of accelerated device lifetime and stress bias) exists. Preferably, the pre-selected number of data points is between about 2 and 5. In alternative embodiments, step 121 further includes using conventional statistical methods, such as regression analysis, to determine whether the database contains sufficient data to accurately predict device lifetime.

If more data is needed, step 123 increments the stress bias to anther value, the cumulative stress time is set to zero, and the stress-measurement cycle (115, 118, 119) repeats with another MISFET until failure occurs.

For the exemplary embodiment described herein, accelerated device lifetime was measured for five stress conditions.

Continuing with FIG. 1, after obtaining accelerating device lifetime for at least two gate voltages, the data is analyzed as described below with respect to FIG. 2. However, continuing briefly with FIG. 1, after analyzing the data, step 125, the data are extrapolated to actual device operating conditions, and device lifetime predicted, step 130. Further details regarding step 130 of FIG. 1, are described below.

Figure 2:
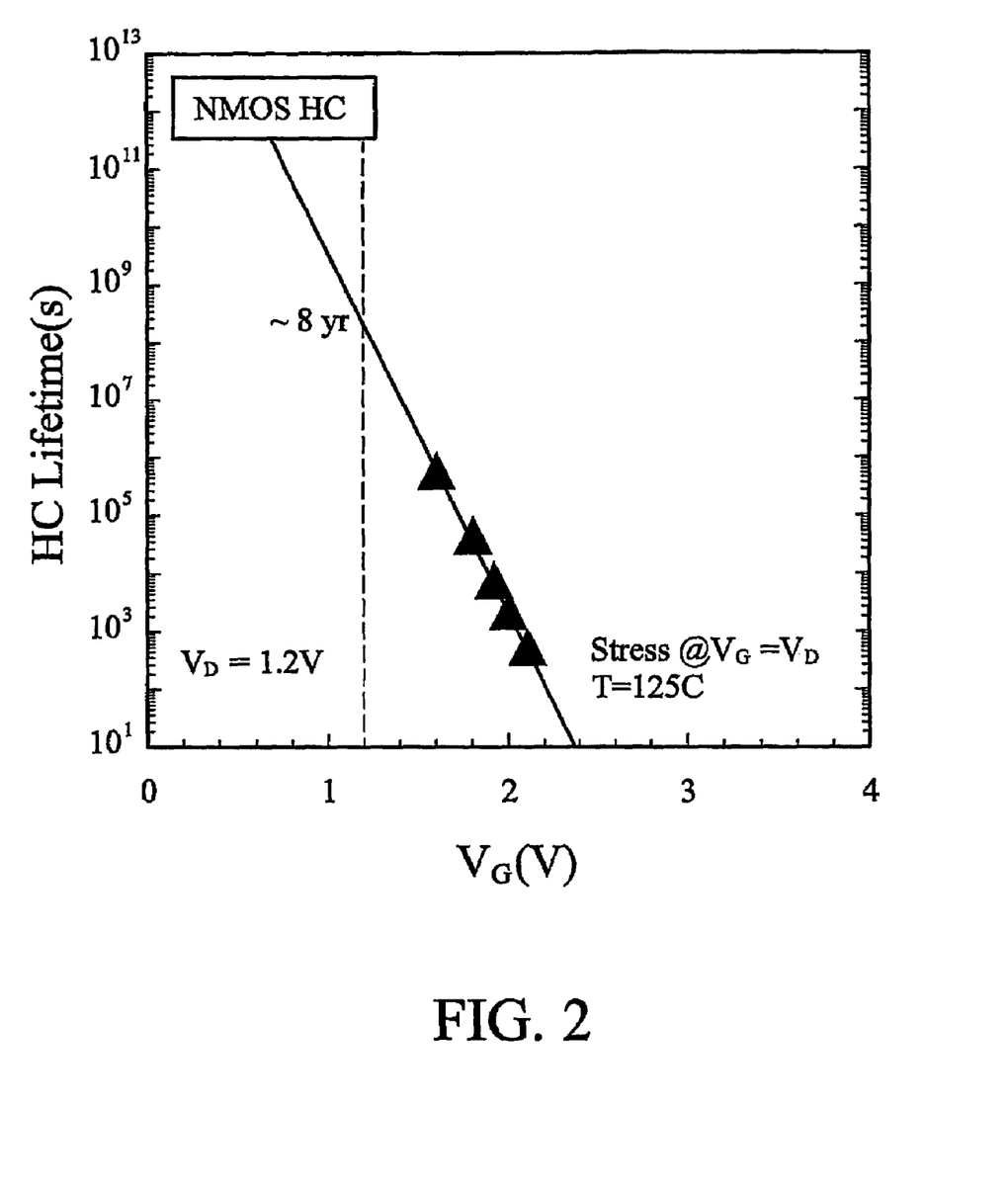
FIG. 2 is a plot of accelerated device lifetime vs. gate stress voltage according to preferred embodiments of the invention.

Turning to FIG. 2, there is a plot of the logarithm of accelerated device lifetime versus gate voltage. Accelerated device lifetime is abbreviated in FIG. 2 as HC Lifetime (s). Unlike conventional methods wherein HC lifetime is plotted versus $1/V_D$, preferred embodiments include plotting HC lifetime as a function of gate voltage. In further accordance with preferred embodiments, the exemplary test devices were stressed at 125° C. The preferred temperature range is about 85 to 125° C. higher than room temperature.

For the exemplary embodiment, the stressed NMOS was a 1.2 V device. In other words, normal operating conditions include $V_D=1.2$ V, which is illustrated by the vertical dashed line at 1.2 V in FIG. 2. The predicted device lifetime at operating conditions is obtained by extrapolating the stress voltage back to 1.2 V. As further shown in FIG. 2, the predicted device lifetime for the exemplary test device is a projected 8 years.

As illustrated in FIG. 2, embodiments of the invention include plotting the logarithm of the accelerated device lifetime as a function of $V_G$, inputting an operating voltage, and then extrapolating the predicted device lifetime corresponding to the operating voltage. Alternative embodiments comprise graphing a y-axis versus an x-axis, wherein the y-axis comprises the logarithm of accelerated device lifetime and the x-axis comprises a positive gate stress voltage, inputting an operating voltage, and then extrapolating the predicted device lifetime corresponding to the operating voltage. Alternative embodiments include plotting that data in an alternative form to make extrapolating the predicted device lifetime more convenient. Plotting, as used herein, includes graphical methods as well as conventional numerical methods that perform essentially the same operation. Likewise, extrapolation, as used herein, is not limited to exemplary embodiments, but also includes numerical methods conventionally called interpolation, as well as other methods that perform essentially the same function.

Figure 3:
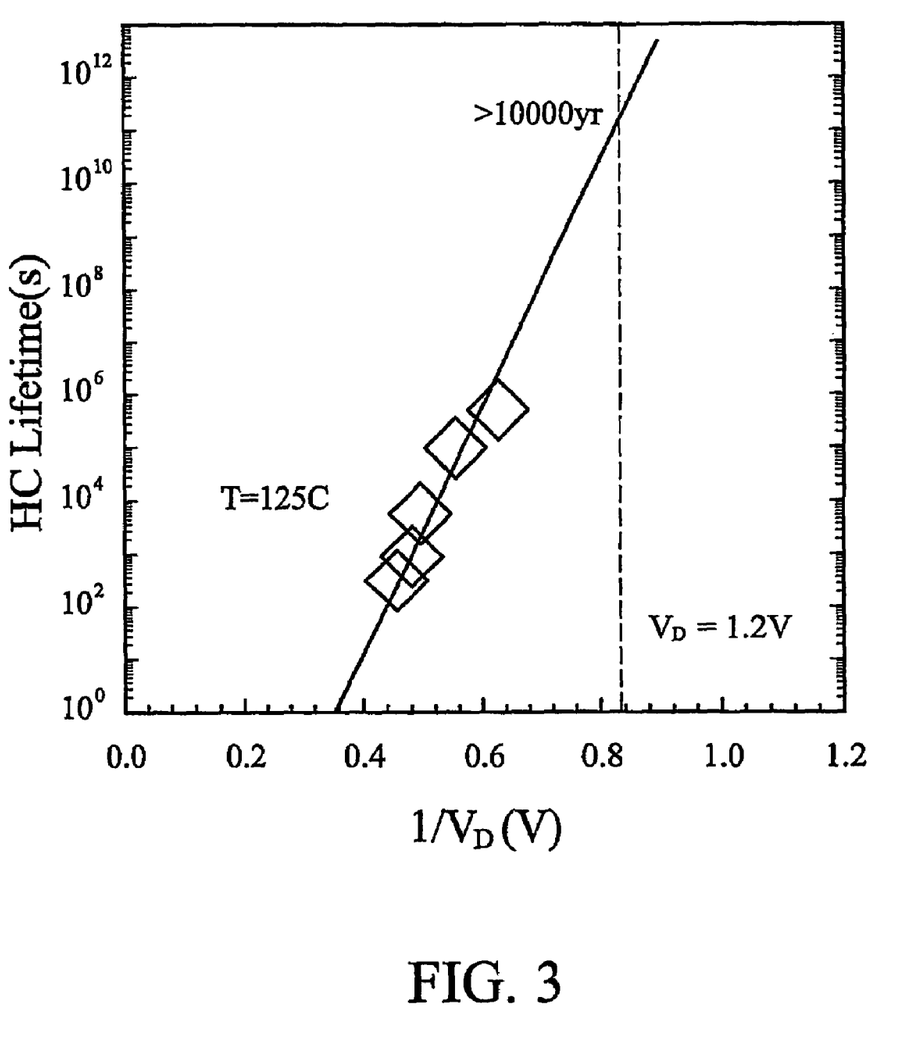
FIG. 3 is a plot illustrating the improved accuracy of embodiments compared to conventional methods.

So as to illustrate the advantage of preferred embodiments, FIG. 3 is a plot of the results of conventional accelerated stress measurements. As is well known in the art, conventional acceleration tests include characterizing HC lifetime in terms of drain bias. For a given drain bias, the gate stress bias is typically selected to maximize HC degradation. For NMOS devices, this typically occurs at a $V_G$ that maximizes the substrate current, i.e. $I_{sub}^{max}$ or $V_G=V_D$. (In ultra-thin gate oxide and short-channel NMOS, the worst stress case is changed from $I_{sub}^{max}$ to $V_G=V_D$). As shown in FIG. 3, when an exemplary high-k NMOS is characterized in a conventional manner, an erroneous predicted device lifetime over 10,000 years results. The measurement summarized in FIG. 3 was conducted with $V_G=V_D$ since this is also the worst stress condition for ultra-thin gate oxide (<20 Å) and short-channel (<0.13 μm) NMOS.

Figure 4:
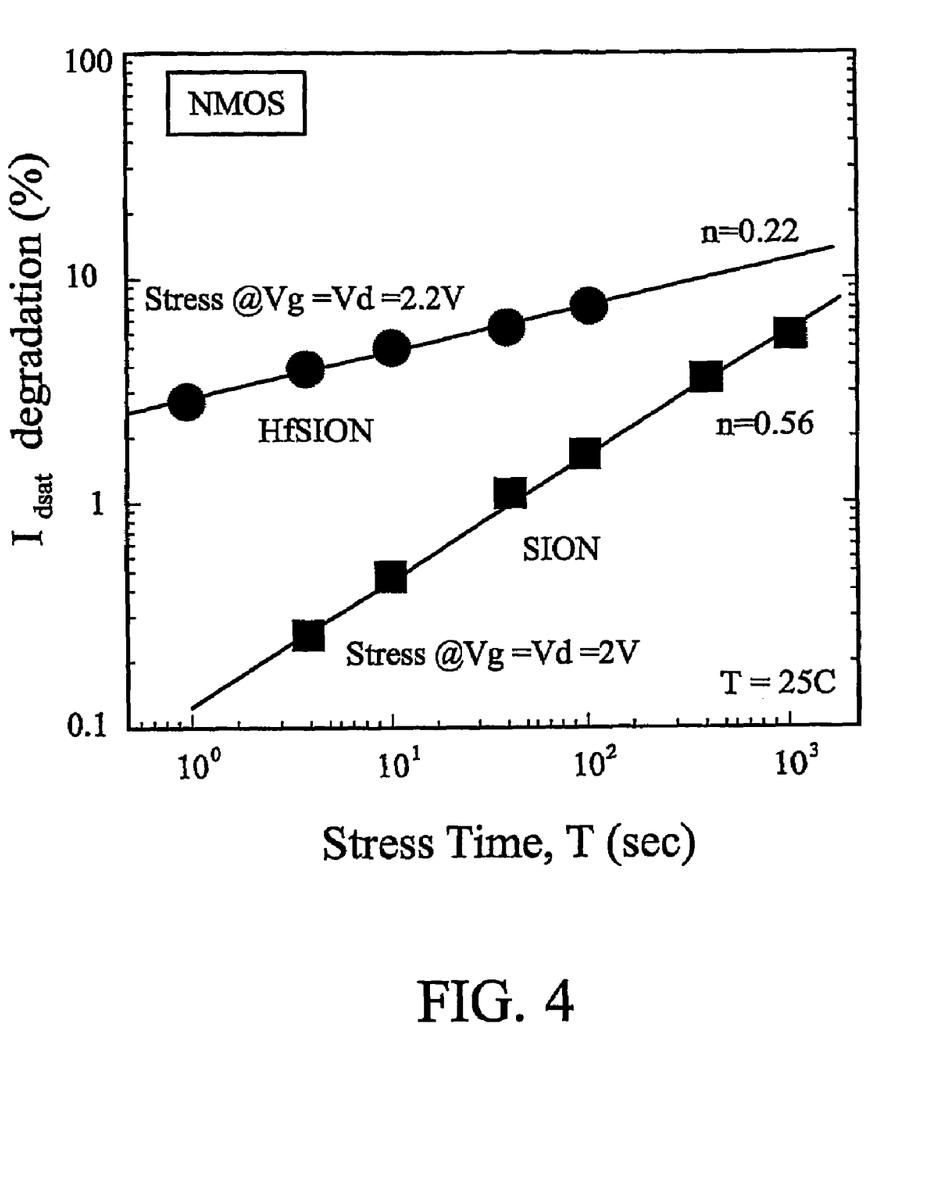
FIG. 4 is a plot illustrating NMOS degradation behavior of high-k and non-high-k dielectrics.

In an effort to explain the failure of conventional methods to accurately predict high-k NMOS HCI device lifetime, Applicants performed several tests aimed at characterizing trap formation. FIG. 4 is a plot of NMOS $I_{dsat}$ degradation vs. stress time for a high-k (HfSiON) as well as a non-high-k (SiON) dielectric. The difference in slope of the dependence of $I_{dsat}$ degradation vs. stress time for a high-k (HfSiON) and a non-high-k (SiON) dielectric suggests different degradation mechanisms. The difference in HCI degradation mechanisms may account for the failure of conventional testing methods to accurately predict device lifetime.

Figure 5A:
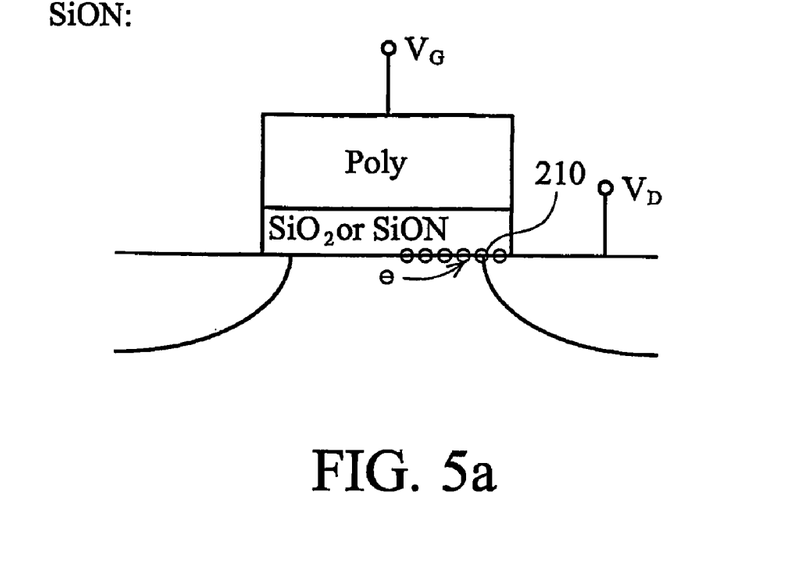
FIGS. 5a and 5b are cross-sectional views illustrating proposed HC degradation mechanisms.
Figure 5B:
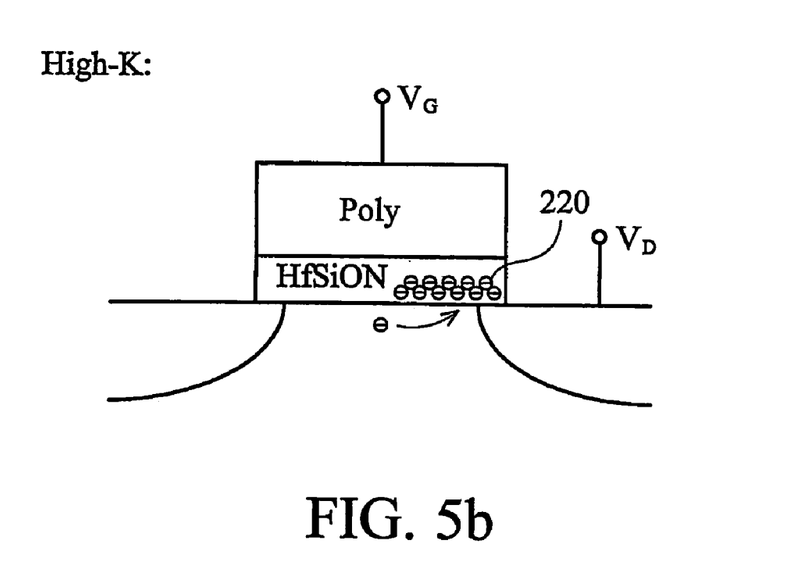

Applicants propose a mechanism that may illustrate the different degradation, i.e. trap formation, mechanisms in FIGS. 5a and 5b. With non-high-k dielectrics, oxide interface states account for HCI degradation. This is illustrated by the oxide interface states ($N_{it}$) 210 shown in FIG. 5a. However, with high-k dielectrics, such as HfSiON, trapped charges ($Q_{ot}$) 220 provide the dominant HCI degradation mechanism, as illustrated in FIG. 5b. Applicants further propose that, in addition to uniform electron trapping caused by $V_G$, more electron trapping near the drain results from hot electrons generated by $V_D$ under HCI stressing. Localized damage near the drain is illustrated in both FIGS. 5a and 5b, since both conventional and preferred embodiments include a drain bias.

Figure 6:
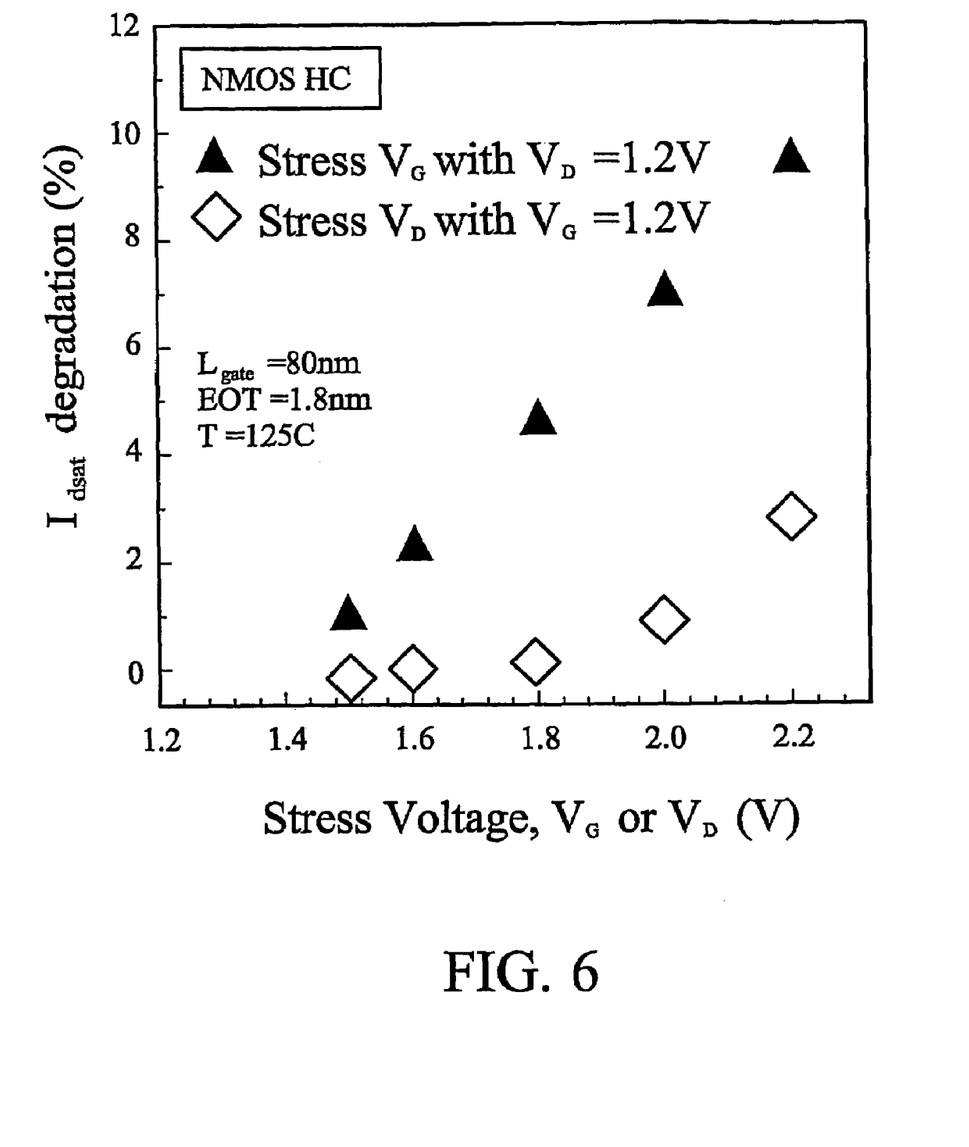
FIG. 6 is a plot showing that gate bias impacts degradation more than drain bias.

Based on the suggested new mechanism of HCI degradation, Applicants further investigated the sensitivity of $I_{dsat}$ degradation to $V_G$ and $V_D$ stressing. FIG. 6 shows that gate bias impacts degradation more than drain bias, further suggesting that electron trapping is mainly driven by gate bias.

Based on this understanding, Applicants also find that the degradation model in HCI ($V_G$ impacts more) in high-k is similar with positive bias temperature instability PBTI (with only $V_G$ stressing, $V_D=0$) in high-k. This understanding suggests a similar lifetime plot (log lifetime vs. $V_G$) for both HCI (preferred embodiments) and PBTI (conventional methods).

Consequently, in accordance with preferred embodiments, the HCI NMOS effect on device lifetime is more accurately predicted by plotting accelerated device lifetime versus gate bias instead of drain bias. The advantage of the new methodology is clearly illustrated by the fact that the predicted device lifetime is at least three orders of magnitude (i.e. 1000 times) different than that predicted by the conventional method (see FIGS. 2 and 3).

In conclusion, the embodiments of the invention described above are exemplary and not limiting. Variations that are apparent to those skilled in the art that include the features of the invention are within the scope of the invention and the appended claims. For example, testing methods work for many high-k dielectrics, in addition to HfSiON.

The high-k dielectric has a k-value substantially greater than about 7. Possible high-k dielectrics include $Ta_2O_5$, $TiO_2$, $Al_2O_3$, $ZrO_2$, $HfO_2$, $Y_2O_3$, $L_2O_3$, and their aluminates and silicates. The high k dielectric material may comprise a single layer of one metal oxide or several layers including two or more metal oxides. Still other possible high-k dielectrics include silicon nitride, hafnium silicon oxynitride, lanthanum oxides, and other high-k dielectric materials known in the art. Still other suitable high-k gate dielectric may include a hafnium-based material, an aluminum-based material, combinations of these and multiple layers of these. Still other suitable high-k gate dielectrics may include oxy-nitride, oxygen containing dielectrics, nitrogen-containing dielectrics, combinations of these and multiple layers of these. Yet still more high-k dielectrics may include any of $HfO_2$, $HfSiO_x$, $HfAlO_x$, zirconium such as $ZrO_2$, aluminum such as $Al_2O_3$, titanium such as $TiO_2$, tantalum pentoxide, lanthanum oxide such as $La_2O_3$, barium strontium compounds such as BST, lead based compounds such as $PbTiO_3$, similar compounds such as $BaTiO_3$, $SrTiO_3$, $PbZrO_3$, PST, PZN, PZT, PMN, metal oxides, metal silicates, metal nitrides, combinations and multiple layers of these. High-k dielectrics may further include Si, Ge, F, C, B, 0, Al, Ti, Ta, La, Ce, Bi, W, or Zr for example. High-k dielectrics may be amorphous, or they may have a nano-crystal structure.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification.

As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of predicting a lifetime of a MISFET having a high-k gate dielectric, the method comprising:
   applying a stress bias to a MISFET gate;
   holding a MISFET drain voltage equal to or less than the stress bias;
   measuring an accelerated device lifetime from a cumulative time needed for the stress bias to cause a pre-selected electrical MISFET parameter shift;
   deriving a functional relationship between the accelerated device lifetime and the stress bias; and
   calculating a MISFET lifetime by inputting a MISFET operating voltage into the functional relationship between the accelerated device lifetime and the stress bias and extrapolating a time corresponding to the MISFET operating voltage.

2. The method of claim 1, wherein the drain voltage is equal to the stress bias.

3. The method of claim 1, wherein the stress bias is a positive voltage.

4. The method of claim 1, wherein the deriving a functional relationship comprises plotting a logarithm of the accelerated device lifetime versus a stress voltage.

5. The method of claim 1, wherein the deriving a functional relationship comprises graphing a y-axis versus an x-axis, wherein the y-axis comprises the logarithm of the accelerated device lifetime and the x-axis comprises a positive gate stress voltage.

6. The method of claim 1, wherein the high-k gate dielectric has a k-value substantially greater than about 7.

7. The method of claim 1, wherein the high-k gate dielectric comprises a hafnium-based material.

8. The method of claim 1, wherein the high-k gate dielectric comprises an aluminum-based material.

9. The method of claim 1, wherein the high-k gate dielectric comprises a nano-crystal material.

10. The method of claim 1, wherein the pre-selected MISFET degradation comprises a shift in threshold voltage ($V_t$).

11. The method of claim 1, wherein the pre-selected MISFET degradation comprises a shift in linear drain current ($I_{DLIN}$).

12. The method of claim 1, wherein the pre-selected MISFET degradation comprises a shift in saturation drain current ($I_{DSAT}$).

13. The method of claim 1, further comprising raising a temperature of the MISFET during the stress period to between about 85 and 125° C.

14. A method to predict a lifetime of an integrated circuit, the method comprising:
    performing an accelerated stress measurement, wherein the accelerated stress measurement comprises
       applying a positive voltage bias to a NMOS gate, wherein the NMOS gate includes a high-k gate dielectric;
       simultaneously setting a NMOS drain bias equal to or less than a stress bias; and
    measuring an accelerated device lifetime, wherein the accelerated device lifetime is the time required for the positive voltage bias to cause a pre-selected, integrated circuit parameter shift;
    deriving a functional relationship between the accelerated device lifetime and the positive voltage bias; and
    inputting a device operating voltage into the functional relationship and numerically extrapolating a corresponding time, wherein the corresponding time provides an estimate of the lifetime of the integrated circuit at normal operating conditions.

15. The method of claim 14, wherein the NMOS drain bias is equal to the stress bias.

16. The method of claim 14, wherein the high-k gate dielectric has a k-value substantially greater than about 7.

17. The method of claim 14, wherein the high-k gate dielectric comprises a hafnium-based material.

18. The method of claim 14, wherein the pre-selected parameter shift comprises a parameter shift selected from the group consisting essentially of a shift in threshold voltage ($V_t$), a shift in linear transconductance ($G_{m,lin}$), a shift in saturation transconductance ($G_{m,sat}$), a shift in linear drain current ($I_{DLIN}$), a shift saturation drain current ($I_{DSAT}$), and a lost in ring oscillator speed.

19. The method of claim 14, wherein the pre-selected parameter shift comprises a parameter shift selected from the group consisting essentially of a 10% shift in linear transconductance ($G_{m,lin}$), 10% shift in saturation transconductance ($G_{m,sat}$), a 10% shift in linear drain current ($I_{DLIN}$), a 10% shift in saturation drain current ($I_{DSAT}$), a 10% loss in ring oscillator speed, or a 20 mV shift in threshold voltage ($V_t$).

20. The method of claim 14, wherein the accelerated stress measurement further comprises holding an integrated circuit temperature to greater than about 85° C.

21. The method of claim 14, wherein the deriving a functional relationship between the accelerated device lifetime and the positive voltage bias includes plotting the logarithm of the accelerated device lifetime versus the positive voltage bias.

* * * * *